United States Patent
Hsieh

[11] Patent Number: 5,821,607
[45] Date of Patent: Oct. 13, 1998

[54] FRAME FOR MANUFACTURING ENCAPSULATED SEMICONDUCTOR DEVICES

[75] Inventor: Wen-Lo Hsieh, Kaohsiung, Taiwan

[73] Assignee: Orient Semiconductor Electronics, Ltd., Kaohsiung, Taiwan

[21] Appl. No.: 780,228

[22] Filed: Jan. 8, 1997

[51] Int. Cl.[6] .................................................. H01L 23/495
[52] U.S. Cl. .................... 257/667; 257/724; 257/787; 361/813; 438/112
[58] Field of Search .................... 257/667, 687, 257/724, 787; 361/813; 438/110, 111, 112

[56] References Cited

U.S. PATENT DOCUMENTS

| | | | |
|---|---|---|---|
| 3,959,874 | 6/1976 | Coucoulas | 257/698 |
| 4,250,347 | 2/1981 | Fierkens | 257/667 |
| 4,611,398 | 9/1986 | Eames et al. | 257/667 |
| 4,803,544 | 2/1989 | Holzschuh et al. | 257/667 |
| 4,818,726 | 4/1989 | Flaten | 257/668 |
| 4,837,184 | 6/1989 | Lin et al. | 257/701 |
| 5,031,022 | 7/1991 | Yamamoto et al. | 257/667 |
| 5,422,163 | 6/1995 | Kamiyama et al. | 257/667 |
| 5,424,577 | 6/1995 | Suzuki et al. | 257/667 |

*Primary Examiner*—David Ostrowski
*Attorney, Agent, or Firm*—Rosenberg, Klein & Bilker

[57] ABSTRACT

A reusable metal frame for manufacturing of encapsulated semiconductor devices includes a metal sheet having a plurality of openings disposed in compliance with topology of semiconductor devices carried by a supporting structure. During the molding operation, the frame is superposed over the supporting structure with each semiconductor device to be encapsulated, positioned centrally within one of the openings. The encapsulating material (resin, plastic, or the like) is supplied to each semiconductor device and stays within each opening, held in place by continuous uninterrupted contour of each opening. After the encapsulating material has been cooled, the metal frame is readily removed, and may be used in other molding operations.

1 Claim, 4 Drawing Sheets

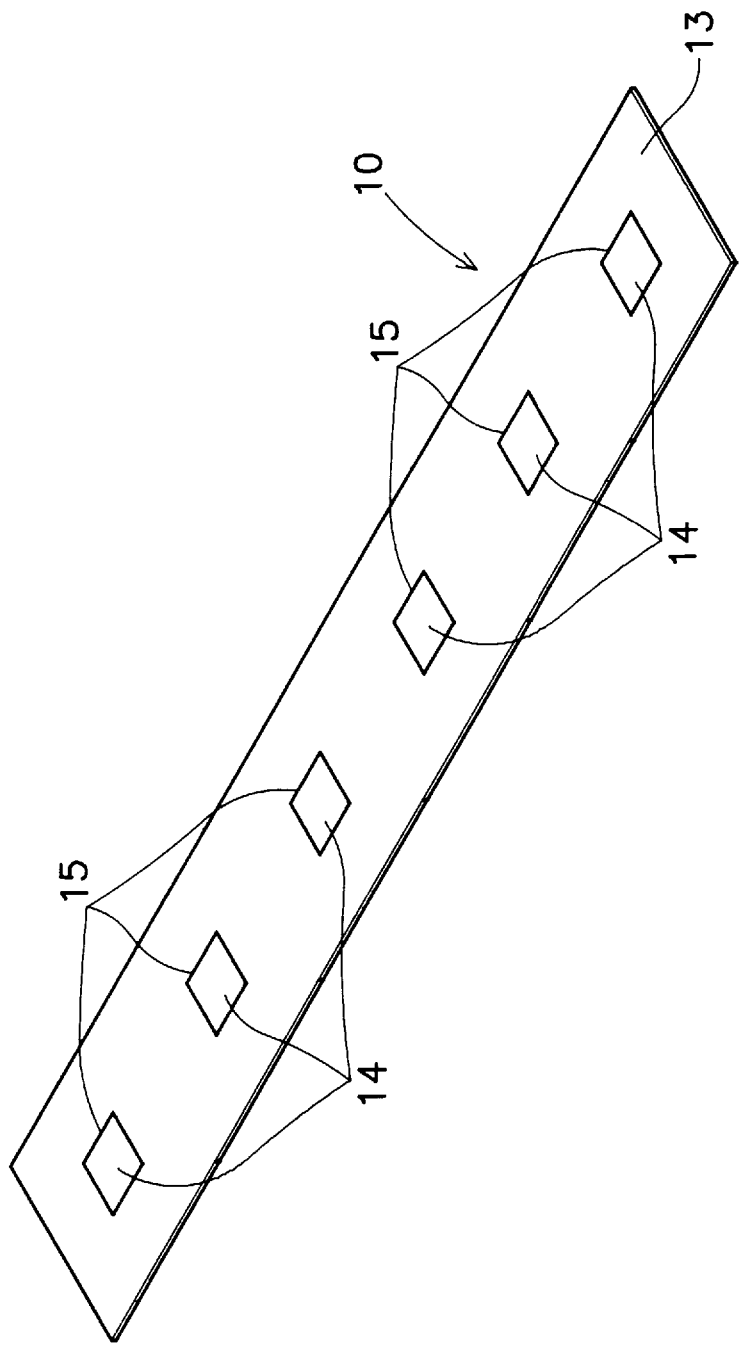

FRAME FOR MANUFACTURING ENCAPSULATED SEMICONDUCTOR DEVICES

FIELD OF THE INVENTION

The present invention relates to a frame for use in manufacture of resin or plastic molded type semiconductor devices, and more particularly, to a supporting frame made from a metal sheet having thickness of 0.003 inches provided with a plurality of window-type openings spaced from each other and removed after the molding has been completed.

PRIOR ART

Normally, for encapsulation of semiconductor devices, a thick and heavy outer frame is used for printed circuit boards of a larger size. After the encapsulation has been completed, the frame is cut to separate the semiconductor devices; that is time consuming. Besides, once the frame has been cut, it cannot be re-used. Also, short-circuits or mis-connections, as well as residues remaining in the printed circuit board may occur, that degrades production efficiency significantly.

SUMMARY OF THE INVENTION

It is, therefore, an object of the present invention to provide a thin bracket (frame) for labor introduced in the manufacturing process for increasing production efficiency, and which may be re-used.

According to the teaching of the present invention, a metal sheet having a plurality of window-type openings is superposed over a supporting structure having a plurality of semiconductor devices to be encapsulated. The metal frame is designed in compliance with the topology of the semiconductor devices on the supporting structure it is intended for, and the dimensions of each opening comply with a semiconductor device it is to superpose, whereby each opening is aligned with contour of the window-type openings is a continuous uninterrupted contour, that provides for re-usability of the frame during repetitive processes of molding (encapsulation).

Once the frame has been superposed over the semiconductor devices, the molding process takes place, after which the frame is easily removed to be used in another molding process.

The metal frame may be made from aluminum, stainless steel or any other suitable alloy. The frame is quite compact since the thickness of the metal sheet is only 0.003 inches, can be readily made, and provides flexibility in the space arrangement. The metal frame can be made in a large quantity with a simplified mold. It benefits in reduced time—and labor—consumption, lowers manufacturing cost, saves semiconductor material, and increases quality of semiconductor devices.

The manufacturing process includes the following steps:
1) die attaching;
2) wire bonding;
3) metal frame setting;
4) molding;
5) removing the metal frame;
6) marking;
7) ball placement; and
8) singulation.

The metal frame and the steps 3 and 5 of introducing and removing the metal frame, are the main features of the present invention. By employing the metal frame of the present invention, the heavy and thick outer frame presently used during the molding of semiconductor devices can be eliminated. The semiconductor chip can be disposed within the window-type openings of the metal frame of the present invention, then the adhesive (resin or plastic) can be injected to mold the semiconductor. The elimination of outer frame can save PCB material, the cutting work is also eliminated.

BRIEF DESCRIPTION OF THE DRAWINGS

In order that the present invention may more readily be understood the following description is given, merely by way of example with reference to the accompanying drawings, in which:

FIG. 4 is the metal frame made according to this invention.

DETAILED DESCRIPTION OF THE PREFERRED EMBODIMENT

Figure 1:
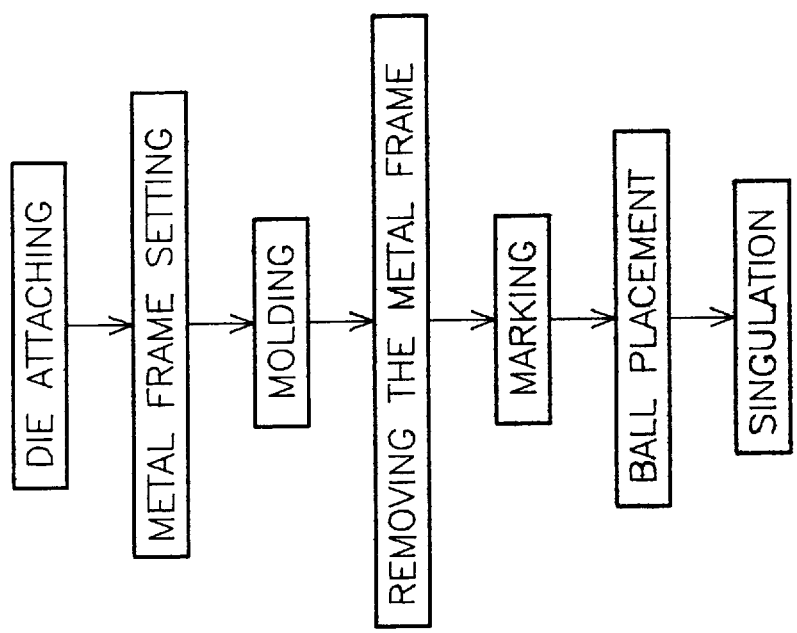
FIG. 1 is a flow chart showing a method of manufacturing of semiconductor devices according to the present invention.

Referring to FIG. 1, the manufacturing process of encapsulating semiconductor devices by means of molding the semiconductor devices with an encapsulating material, such as plastic, resin, and the like, includes two novel steps, i.e. "Metal Frame Setting" before molding and "Removing the Metal Frame" after the molding.

Figure 2:
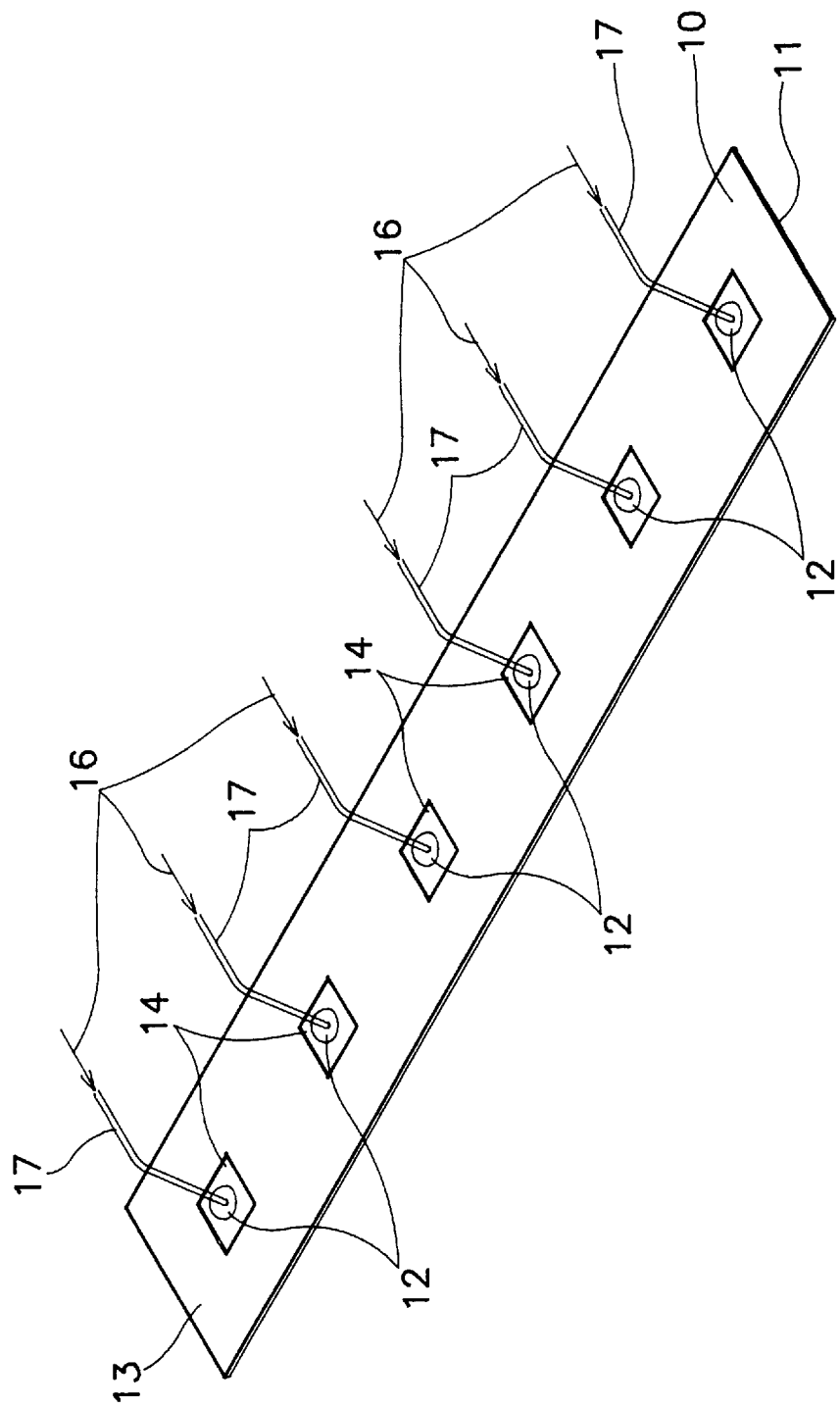
FIG. 2 is a schematic illustration of the metal frame made according to this invention, superposed over the structure having a plurality of semiconductor devices with means supplying resin or plastic to each semiconductor device within openings in the metal frame.
Figure 3:
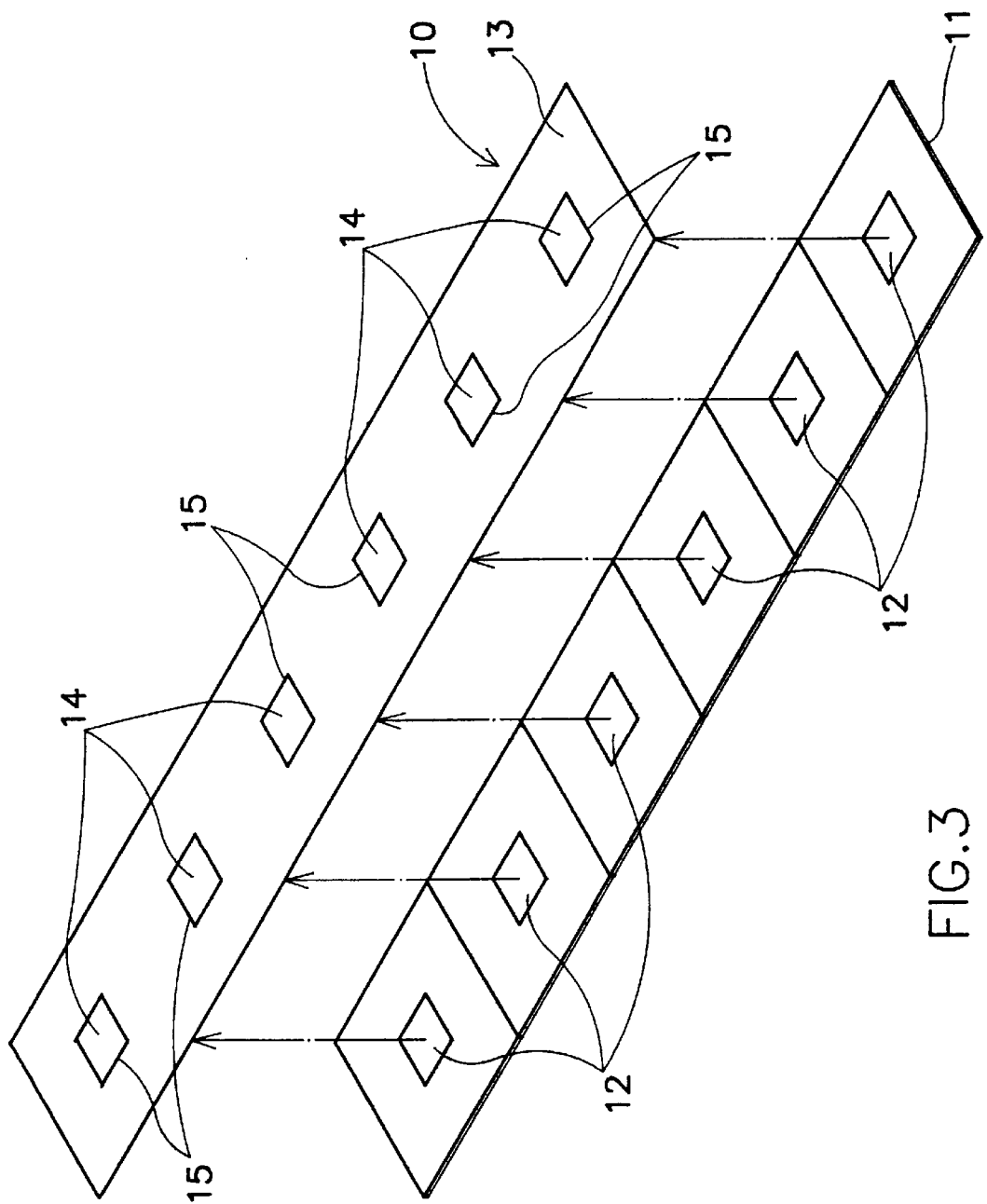
FIG. 3 is a schematic illustration of the metal frame removed from the structure after the molding has been accomplished (encapsulated semiconductor devices are schematically presented on the structure)

The metal frame 10 of the present invention is best shown in FIGS. 2–4 and will be described in detail further herein. Referring to FIGS. 2 and 3, a supporting structure 11 has a plurality of semiconductor devices 12 to be individually encapsulated. The semiconductor devices 12 are disposed on the supporting structure 11 in a desired topological order.

The metal frame 10, best shown in FIGS. 2–4, includes a thin metal sheet 13 made of aluminum, stainless steel, or any other suitable alloy, thickness of which does not exceed 0.003 inches, and a plurality of window-like openings 14, each having uninterrupted continuous contour 15. The openings 14 are disposed in the sheet 13 in compliance with topology of the semiconductor devices 12. Additionally, each opening 14 has dimensions corresponding to dimensions of semiconductor devices 12 they are intended for.

As best shown in FIG. 2, during the step of molding, the frame 10 is superposed over the supporting structure 11, with each semiconductor device 12 aligned centrally within a respective one of the openings 14. The encapsulating material 16 (resin, plastic, or the like) is injected by means of injection pipes 17, whereby the contour 15 of the openings 14 holds the encapsulating material 16 within the openings 14. When the encapsulating material 16 is cured and cooled, the metal frame 10 can be removed therefrom. Then the lot number and specifications can be advantageously marked thereon. Afterward, a step of ball placement is performed and the frame of the semiconductor (supporting structure) 11 is removed. The resulting encapsulated semiconductor device 12 can be used as an electronic circuit or as a chip in computer or pertinent equipment.

The manufacturing process made according to this invention has the following advantages:

1. Production: the manufacturing process and the fixture are simplified.
2. The metal frame can be readily made, assembled and removed. Most important, it can be repeatedly used.
3. The use of PCB material can be largely reduced.
4. The defective yield of the semiconductor can be considerably reduced.
5. The metal frame can be made with different window-type openings for different applications.

While particular embodiment of the present invention has been illustrated and described, it would be obvious to those skilled in the art that various other changes and modifications can be made without departing from the spirit and scope of the invention. It is therefore intended to cover in the appended claims all such changes and modifications that are within the scope of the present invention.

I claim:

1. A reusable frame for sequential use with a plurality of supporting structures, each supporting structure carrying a plurality of semiconductor devices to be individually encapsulated said reusable frame comprising a sheet made of a metal having a plurality of openings formed therethrough, each of said openings being bounded by a perimeter edge having a continuous contour each of said openings being dimensioned to correspond to dimensions of a respective one said semiconductor devices and positioned in correspondence therewith, said frame being superposed over a first of the plurality of supporting structures with each of said semiconductor devices positioned within a respective one of said openings during a molding process where an encapsulating material is applied to each semiconductor device to be encapsulated, the encapsulating material being held substantially within said continuous contour surrounding said openings, said frame being readily removed from said first supporting structure subsequent to said encapsulating material application and being positioned on a second of the plurality of supporting structures for use during encapsulation of semiconductor devices thereon.

* * * * *